United States Patent
Tsuji et al.

(10) Patent No.: US 10,090,417 B2
(45) Date of Patent: Oct. 2, 2018

(54) SILICON CARBIDE SEMICONDUCTOR DEVICE AND FABRICATION METHOD OF SILICON CARBIDE SEMICONDUCTOR DEVICE

(71) Applicant: FUJI ELECTRIC CO., LTD., Kawasaki-shi, Kanagawa (JP)

(72) Inventors: Takashi Tsuji, Tsukuba (JP); Akimasa Kinoshita, Tsukuba (JP); Noriyuki Iwamuro, Tsukuba (JP); Kenji Fukuda, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/404,827

(22) PCT Filed: Mar. 18, 2013

(86) PCT No.: PCT/JP2013/057747
§ 371 (c)(1),
(2) Date: Dec. 1, 2014

(87) PCT Pub. No.: WO2013/179728
PCT Pub. Date: Dec. 5, 2013

(65) Prior Publication Data
US 2015/0144965 A1    May 28, 2015

(30) Foreign Application Priority Data
May 31, 2012 (JP) .................................. 2012-125254

(51) Int. Cl.
*H01L 29/15* (2006.01)
*H01L 21/44* (2006.01)
(Continued)

(52) U.S. Cl.
CPC ...... *H01L 29/872* (2013.01); *H01L 21/02529* (2013.01); *H01L 29/0615* (2013.01);
(Continued)

(58) Field of Classification Search
CPC ............... H01L 29/872; H01L 29/0615; H01L 29/0619; H01L 29/1608; H01L 29/66143
(Continued)

(56) References Cited

U.S. PATENT DOCUMENTS 6,002,159 A    12/1999  Bakowski et al.
7,851,881 B1 *  12/2010  Zhao ................... H01L 21/0495
                                                          257/155
(Continued)

FOREIGN PATENT DOCUMENTS

JP    9-162422 A    6/1997
JP    2003-101039 A    4/2003
(Continued)

OTHER PUBLICATIONS

Notification of Transmittal of Translation of the International Preliminary Report on Patentability dated Dec. 11, 2014 (form PCT/IB/338) of International Application No. PCT/JP2013/057747, with forms PCT/IB/373, PCT/ISA/237 (w/English translation) and PCT/IB/326 (12 pages).
(Continued)

*Primary Examiner* — Fernando L Toledo
*Assistant Examiner* — Aaron Gray
(74) *Attorney, Agent, or Firm* — Westerman, Hattori, Daniels & Adrian, LLP

(57) ABSTRACT

A p-type region, a $p^-$ type region, and a $p^+$ type region are selectively disposed in a surface layer of a silicon carbide substrate base. The p-type region and the $p^-$ type region are disposed in a breakdown voltage structure portion that surrounds an active region. The $p^+$ type region is disposed in
(Continued)

the active region to make up a JBS structure. The p⁻ type region surrounds the p-type region to make up a junction termination structure. A Schottky electrode forms a Schottky junction with an n-type silicon carbide epitaxial layer. The Schottky electrode overhangs an interlayer insulation film covering a portion of the p-type region and this overhanging portion acts as a field plate. The p⁺ type region has an acceptor concentration greater than or equal to a predetermined concentration and can make a forward surge current larger.

3 Claims, 2 Drawing Sheets

(51) Int. Cl.
    H01L 29/47      (2006.01)
    H01L 29/66      (2006.01)
    H01L 21/322     (2006.01)
    H01L 21/425     (2006.01)
    H01L 21/28      (2006.01)
    H01L 29/872     (2006.01)
    H01L 29/06      (2006.01)
    H01L 29/08      (2006.01)
    H01L 29/16      (2006.01)
    H01L 21/02      (2006.01)
    H01L 29/36      (2006.01)

(52) U.S. Cl.
    CPC .......... *H01L 29/0619* (2013.01); *H01L 29/08* (2013.01); *H01L 29/1608* (2013.01); *H01L 29/36* (2013.01); *H01L 29/47* (2013.01); *H01L 29/66143* (2013.01)

(58) Field of Classification Search
    USPC ... 257/77, 471, 483, 484, E29.338, E29.012, 257/E29.013; 438/570, 571, 931, 529
    See application file for complete search history.

(56) References Cited

U.S. PATENT DOCUMENTS

| | | | |
|---|---|---|---|
| 2003/0067033 A1 | 4/2003 | Kinoshita et al. | |
| 2006/0118812 A1* | 6/2006 | Ohtsuka | H01L 29/0619 257/107 |
| 2008/0277668 A1* | 11/2008 | Okuno | H01L 29/0692 257/77 |
| 2008/0277669 A1 | 11/2008 | Okuno et al. | |
| 2011/0151654 A1* | 6/2011 | Konishi et al. | 438/530 |
| 2011/0175106 A1 | 7/2011 | Mizukami et al. | |
| 2011/0195563 A1* | 8/2011 | Okuno | H01L 21/0465 438/518 |
| 2011/0207321 A1* | 8/2011 | Fujiwara | H01L 21/324 438/663 |

FOREIGN PATENT DOCUMENTS

| | | |
|---|---|---|
| JP | 2003-158259 A | 5/2003 |
| JP | 2003-303956 A | 10/2003 |
| JP | 2008-034646 A | 2/2008 |
| JP | 2008-282973 A | 11/2008 |
| JP | 2009-044177 A | 2/2009 |
| JP | 2010-087483 A | 4/2010 |
| JP | 2011-151208 A | 8/2011 |
| JP | 2011-165856 A | 8/2011 |
| JP | 2012-069798 A | 4/2012 |

OTHER PUBLICATIONS

International Search Report dated May 14, 2014, issued in corresponding application No. PCT/JP2013/057747.

Peters et al., "Comparison of 4H—SiC pn, Pinch and Schottky Diodes for the 3 kV Range", Materials Science Forum, 2002, vols. 389-393, pp. 1125-1128, cited in Japanese Information Statement dated Aug. 7, 2015 (3 pages).

Treu et al., "A Surge Current Stable and Avalanche Rugged SiC Merged pn Schottky Diode Blocking 600V Especially Suited for PFC Applications", Materials Science Forum, 2006, vols. 527-529, pp. 1155-1158, cited in Japanese Information Statement dated Aug. 7, 2015 (3 pages).

Dahlquist et al., "A JBS Diode with Controlled Forward Temperature Coefficient and Surge Current Capability", Materials Science Forum, 2002, vols. 389-393, pp. 1129-1132, cited in Japanese Information Statement dated Aug. 7, 2015 (3 pages).

Japanese Information Statement dated Aug. 7, 2015, issued in counterpart Japanese Patent Application No. 2012-125254, w/English partial translation (55 pages.

Office Action dated Aug. 29, 2017, issued in counterpart Japanese Application No. 2017-101263, with partial English translation. (11 pages).

* cited by examiner

SILICON CARBIDE SEMICONDUCTOR DEVICE AND FABRICATION METHOD OF SILICON CARBIDE SEMICONDUCTOR DEVICE

TECHNICAL FIELD

The present invention relates to a silicon carbide semiconductor device and a fabrication method of a silicon carbide semiconductor device.

BACKGROUND ART

A silicon carbide semiconductor (SiC) has a large band gap as compared to a silicon semiconductor (Si) and therefore, has a high critical dielectric field intensity. ON-resistance is resistance in a conductive state and is inversely proportional to the cube of the critical dielectric field intensity. Therefore, for example, widely used silicon carbide semiconductors called a 4H type can suppress the ON-resistance to a few hundredths as compared to silicon semiconductors. The silicon carbide semiconductors also have large thermal conductivity characteristics facilitating heat dissipation. As described above, SiC is expected as a next-generation, low-loss power semiconductor element and silicon carbide semiconductor elements having various structures are developed as Schottky barrier diodes, MOSFETs, PN diodes, IGBTs, GTOs, etc.

Among these elements, Schottky barrier diodes are unipolar devices and therefore, have very small reverse recovery current at the time of turn-off and is expected to replace Si-pin diodes.

Fabrication of a Schottky barrier diode will hereinafter roughly be described. First, an n-type epitaxial layer having a film thickness of 10 μm and a donor concentration of $1 \times 10^{16}$ cm$^{-3}$ is grown and formed on a low-resistance n-type 4H-SiC substrate. A p-type well region having a concentration on the level of $10^{17}$ cm$^{-3}$ is formed into a ring shape on the n-type epitaxial layer. On the outside of this p-type well region, a p-type well region having a concentration lower than the p-type well region may be disposed. On the outside of the low-concentration p-type well region, multiple low-concentration p-type well regions may further be disposed. The p-type well region is formed by Al ion implantation and annealing at a high temperature greater than or equal to 1600 degrees C. The p-type well region is referred to as an element termination structure and has a function of alleviating an electric field at the termination end of the element to prevent deterioration in breakdown voltage.

In some elements, multiple p-type well regions having an accepter concentration of $1 \times 10^{18}$ cm$^{-3}$ or higher may partially be formed at predetermined intervals in an internal region surrounded by the p-type well region on the n-type epitaxial layer. This structure is referred to as a junction barrier Schottky (JBS) diode. Since an n-type region disposed between p-type well regions can be pinched off at the time of reverse bias, this structure can advantageously reduce a leak current in the reverse direction. A distance between the adjacent p-type well regions is set to a dimension of several μm so that the n-region disposed between the p-type wells can be pinched off.

Subsequently, an oxide film patterned to exclude a portion of the p-type well region and the inside region thereof is formed, and Schottky metal is formed to overhang the oxide film. Although an ohmic electrode may be formed on a surface of the p-type well region of JBS, this increases the number of steps leading to an increase in manufacturing costs and, therefore, the surface of the p-type well region of JBS is generally coated with the Schottky metal to achieve Schottky contact. Subsequently, Al metal, polyimide, and a back surface metal (back surface electrode) are sequentially formed to complete the Schottky diode.

When the positive bias that is applied to an anode electrode of the Al metal of the Schottky diode fabricated as described above is increased, a forward current accordingly increases and a reaction (silicidation or carbonization of Ti) eventually occurs in the interface between the Schottky metal and SiC due to heat generation thereby, which reduces a Schottky barrier height. This allows more current to flow and self-heat-generation applies positive feedback facilitating the interface reaction, eventually leading to thermal destruction. The forward current in this case is referred to as a surge current. A wide band gap semiconductor is disclosed that has improved resistance to such a surge current (see. e.g., Patent Document 1).

Japanese Laid-Open Patent Publication No. 2011-151208

DISCLOSURE OF INVENTION

Problem to be Solved by the Invention

Nonetheless, forward current $I_{F,SM}$ must be increased as much as possible in a given semiconductor device. For example, if a semiconductor device is configured by connecting chips in parallel, all of the current may concentrate at one chip at the time of turn-on and a problem of destruction of this chip occurs unless the forward current $I_{F,SM}$ is sufficiently large.

In one method of increasing the forward current $I_{F,SM}$, an ohmic electrode is formed on a p-type well region so that holes are injected in an n-type drift layer when a potential of p-n junction is 2.5 V or higher exceeding a built-in potential $V_{BI}$. However, this technique requires the formation of the ohmic electrode, causing a problem of increased production cost.

It is an object of the present invention to provide a silicon carbide semiconductor device and a fabrication method of a silicon carbide semiconductor device capable of making a forward current sufficiently large and improving breakdown voltage so as to eliminate the problems of the conventional technologies described above.

Means for Solving Problem

To solve the problems described above and achieve an object of the present invention, a silicon carbide semiconductor device according to the present invention has the following characteristics. On a surface of a first-conductivity-type wide band gap semiconductor substrate, a first-conductivity-type wide band gap semiconductor deposition layer is deposited having an impurity concentration that is lower than that of the first-conductivity-type wide band gap semiconductor substrate. A first second-conductivity-type semiconductor region is selectively disposed in a surface layer of the first-conductivity-type wide band gap semiconductor deposition layer on a side opposite to the first-conductivity-type wide band gap semiconductor substrate. An element structure is included that is made up of a metal film forming a Schottky junction with the first-conductivity-type wide band gap semiconductor deposition layer and the first second-conductivity-type semiconductor region. A second second-conductivity-type semiconductor region surrounding a peripheral portion of the element structure is selectively disposed in a surface layer of the first-conductivity-type wide band gap semiconductor deposition layer on the side opposite to the first-conductivity-type wide band gap semiconductor substrate. A third second-conductivity-type semiconductor region is included that surrounds a peripheral portion of the second second-conductivity-type semiconductor region to make up a junction termination structure. The first or second second-conductivity-type semiconductor region has an acceptor concentration greater than or equal to a predetermined concentration.

In the silicon carbide semiconductor device, the acceptor concentration of the first or second second-conductivity-type semiconductor region is greater than $8 \times 10^{17}$ (cm$^{-3}$).

A fabrication method of a silicon carbide semiconductor device according to the present invention has the following characteristics. The method includes depositing on a surface of a first-conductivity-type wide band gap semiconductor substrate, a first-conductivity-type wide band gap semiconductor deposition layer having an impurity concentration that is lower than that of the first-conductivity-type wide band gap semiconductor substrate. The method subsequently includes selectively forming a first second-conductivity-type semiconductor region in a surface layer of the first-conductivity-type wide band gap semiconductor deposition layer on a side opposite to the first-conductivity-type wide band gap semiconductor substrate and forming an element structure from a metal film forming a Schottky junction with the first-conductivity-type wide band gap semiconductor deposition layer and the first second-conductivity-type semiconductor region. The method further includes selectively forming a second second-conductivity-type semiconductor region in a surface layer of the first-conductivity-type wide band gap semiconductor deposition layer to surround a peripheral portion of the first second-conductivity-type semiconductor region; and selectively forming in a surface layer of the first-conductivity-type wide band gap semiconductor deposition layer, a third second-conductivity-type semiconductor region having an impurity concentration that is lower than that of the second second-conductivity-type semiconductor region, the third second-conductivity-type semiconductor region formed to surround a peripheral portion of the second second-conductivity-type semiconductor region and make up a junction termination structure. Furthermore, the first or second second-conductivity-type semiconductor region has an acceptor concentration that is greater than or equal to a predetermined concentration.

According to the invention described above, since the first or second second-conductivity-type semiconductor region has an acceptor concentration greater than or equal to a predetermined concentration, the reverse bias voltage can be reduced and the forward surge current can be made larger.

Effect of the Invention

The silicon carbide semiconductor device and the fabrication method of a silicon carbide semiconductor device according to the present invention produce an effect that the forward current can be made sufficiently large while the breakdown voltage can be improved.

BEST MODE(S) FOR CARRYING OUT THE INVENTION

Preferred embodiments of a silicon carbide semiconductor device and a fabrication method of a silicon carbide semiconductor device according to the present invention will be described in detail with reference to the accompanying drawings. In this description and the accompanying drawings, layers and regions prefixed with n or p mean that majority carriers are electrons or holes, respectively. Additionally, + and − added to n or p mean that the impurity concentration is higher and lower, respectively, than layers and regions without + and −.

(Embodiment)

Figure 1:
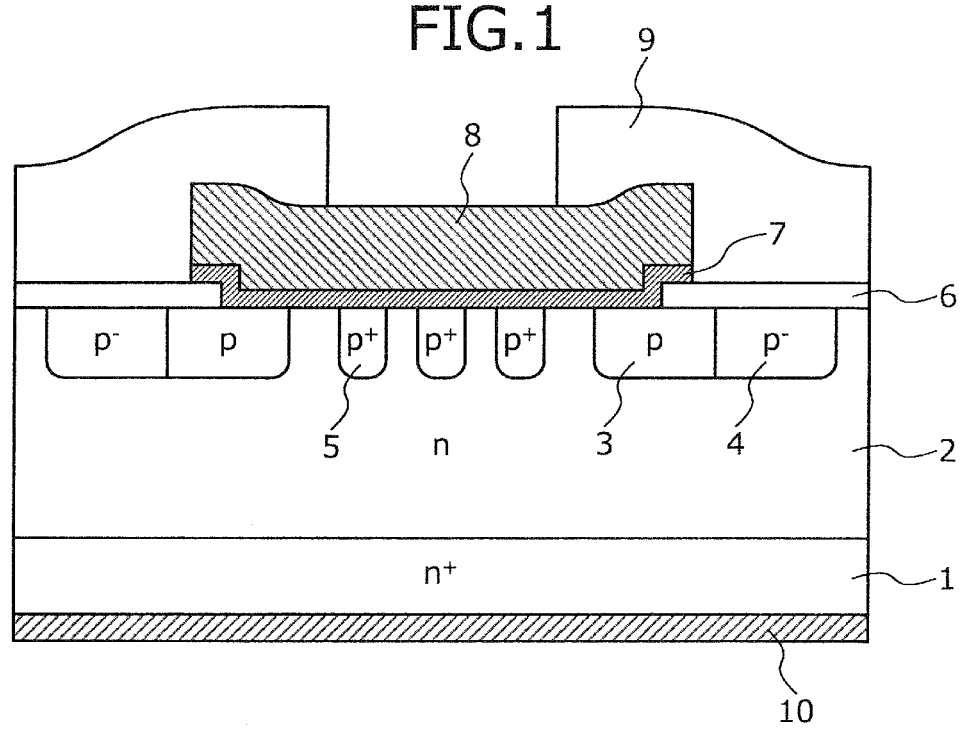
FIG. 1 is a cross-sectional view of a silicon carbide semiconductor device according to an embodiment.

A semiconductor device according to the present invention is formed by using a wide band gap semiconductor. In an embodiment, a silicon carbide semiconductor device produced by using, for example, silicon carbide (SiC) as a wide band gap semiconductor will be described by taking a Junction Barrier Schottky (JBS) structure diode as an example. FIG. 1 is a cross-sectional view of a silicon carbide semiconductor device according to the embodiment. As depicted in FIG. 1, the silicon carbide semiconductor device according to the embodiment has an n-type silicon carbide epitaxial layer (wide band gap semiconductor deposition layer) 2 disposed on a principal plane of an n$^+$ type silicon carbide substrate (wide band gap semiconductor substrate) 1.

The n$^+$ type silicon carbide substrate 1 is a silicon carbide monocrystalline substrate doped with nitrogen (N), for example. The n-type silicon carbide epitaxial layer 2 is a low-concentration n-type drift layer doped with, for example, nitrogen, at an impurity concentration that is lower than the n$^+$ type silicon carbide substrate 1. In the following description, a silicon carbide semiconductor base refers to the n$^+$ type silicon carbide substrate 1 alone, or refers to the n$^+$ type silicon carbide substrate 1 and the n-type silicon carbide epitaxial layer 2, collectively. In a surface layer of the n-type silicon carbide epitaxial layer 2 on the side opposite to the n$^+$ type silicon carbide substrate 1 (on the front surface side of the silicon carbide semiconductor base), a ring-shaped p-type region 3 is disposed, and a p$^-$ type region 4 is disposed on the outer periphery of the P-type region 3. Further, on an inner periphery of the p-type region 3, a p+ type region 5 is disposed.

The p-type region 3 (second second-conductivity-type semiconductor region) is disposed in a breakdown voltage structure portion surrounding an active portion disposed in a peripheral portion of the active region. The breakdown voltage structure portion is a region retaining a breakdown voltage. The p-type region 3 is disposed closer to the active region provided with a diode element structure and is in contact with a Schottky electrode 7 forming the Schottky junction with the n-type silicon carbide epitaxial layer 2. The Schottky electrode 7 will be described later.

The p-type region 3 is doped with, for example, aluminum (Al) at an impurity concentration that is higher than that of the p$^-$ type region 4. The impurity concentration of the p-type region 3 is preferably greater than or equal to a predetermined concentration as described later. The reason is that the effects of the present invention notably appear. The p-type region 3 has a function of preventing electric field concentration on a junction end portion between the n-type silicon carbide epitaxial layer 2 and the Schottky electrode 7. The p⁻ type region 4 has a function of further dispersing the electric field in the peripheral portion of the active region. The p⁺ type region 5 and the p⁻ type region 4 are respectively doped with aluminum, for example.

The multiple p⁺ type regions (first second-conductivity-type semiconductor regions) 5 are disposed in the active region at predetermined intervals to make up a JBS structure (element structure). The p⁺ type regions 5 are disposed separately from the p-type region 3. The p⁻ type region (third second-conductivity-type semiconductor region) 4 is disposed to be in contact with a peripheral portion of the p-type region 3 to surround the p-type region 3, thereby making up a junction termination extension (JTE) structure. Therefore, the p-type region 3 and the p⁻ type region 4 are arranged in this order in parallel from the active region side toward the breakdown voltage structure portion.

An interlayer insulation film 6 is disposed on the breakdown voltage structure portion to cover a portion of the p-type region 3 closer to the p⁻ type region 4 as well as the p⁻ type region 4. A back surface electrode (ohmic electrode) 10 forming ohmic junction with the n⁺ type silicon carbide substrate 1 is disposed on a surface of the n⁺ type silicon carbide substrate 1 on the side opposite to the n-type silicon carbide epitaxial layer 2 (on the back surface of the silicon carbide semiconductor base). The back surface electrode 10 makes up a cathode electrode. The Schottky electrode 7 making up an anode electrode is disposed on the surface of the n-type silicon carbide epitaxial layer 2 on the side opposite to the n⁺ type silicon carbide substrate 1 (on the front surface of the silicon carbide semiconductor base). The Schottky electrode 7 is disposed across the active region and a portion of the breakdown voltage structure portion.

For example, the Schottky electrode 7 covers the entire surface of the n-type silicon carbide epitaxial layer 2 (the front surface of the silicon carbide semiconductor base) exposed in the active region and comes into contact with the p-type region 3 in the peripheral portion of the active region. The Schottky electrode 7 is disposed to extend from the active region to the breakdown voltage structure portion and overhangs the interlayer insulation film 6. The Schottky electrode 7 covers the p-type region 3 via the interlayer insulation film 6. Therefore, an end portion of the Schottky electrode 7 most extended into the breakdown voltage structure portion is terminated on the p-type region 3 for the JTE structure.

The Schottky electrode 7 is preferably made of the following materials because the effects of the present invention notably appear. The Schottky electrode 7 is preferably made of a group IVa metal, group Va metal, group VIa metal, aluminum, or silicon. Alternatively, the Schottky electrode 7 is preferably made of a composite film having two or three elements of the group IVa metal, group Va metal, group VIa metal, aluminum, and silicon. Particularly, the Schottky electrode 7 is made of titanium (Ti), aluminum, or silicon, or is preferably a composite film having two or three elements among titanium, aluminum, and silicon. More preferably, in the Schottky electrode 7, a portion forming the Schottky junction with the n-type silicon carbide epitaxial layer 2 is made of titanium (Ti), for example.

If the silicon carbide semiconductor device according to the embodiment is used as a high-voltage semiconductor device, the Schottky barrier height of the Schottky electrode 7 and the n-type silicon carbide epitaxial layer 2 is preferably greater than or equal to 1 eV, for example. If the silicon carbide semiconductor device according to the embodiment is used as a power source device, the Schottky barrier height of the Schottky electrode 7 is preferably greater than or equal to 0.5 eV and less than 1 eV, for example.

For example, an electrode pad 8 made of aluminum is disposed on the Schottky electrode 7. The electrode pad 8 is extended from the active region to the breakdown voltage structure portion, and an end portion thereof most extended into the breakdown voltage structure portion is terminated on the Schottky electrode 7. A protection film 9 such as a passivation film made of, for example, polyimide, is disposed on the JTE structure to cover the end portions of the Schottky electrode 7 and the electrode pad 8 most extended into the breakdown voltage structure portion. The protection film 9 has a function of discharge prevention.

Figure 2:
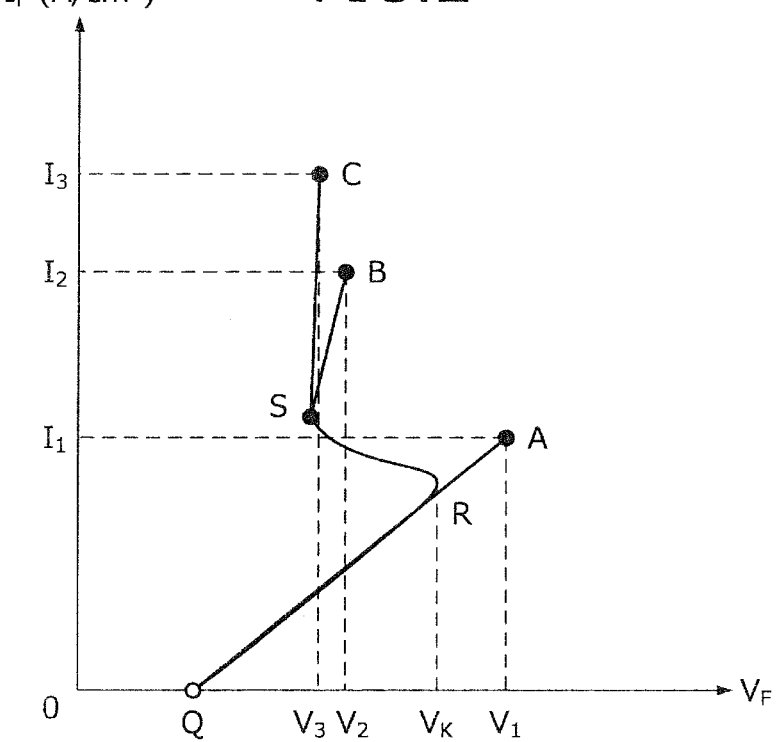
FIG. 2 is a chart of V-I characteristics of the embodiment.

FIG. 2 is a chart of V-I characteristics of the embodiment. The horizontal axis indicates positive bias $V_F$ (V) applied to the anode electrode of the Al metal of the Schottky diode, and the vertical axis indicates forward current $I_F$ (A/cm²). FIG. 2 includes, for example, $V_3=3.5$ V, $V_2=4$ V, $V_1=5$ V, $I_1=540$ A/cm², $I_2=675$ A/cm², and $I_3=771$ A/cm².

1. When the Anode Electrode (Schottky Electrode) 7 is in Schottky Junction in Entire Interface with the n-type Silicon Carbide Epitaxial Layer 2 (Comparison Example)

In this case, an increase in the positive bias $V_F$ increases the forward current $I_F$ and generates heat. Eventually, self-heat-generation causes a reaction in the Schottky junction, for example, Ti+SiC→TiC+Si, resulting in alloying, which makes a Schottky barrier height ($\varphi_B$) lower. As a result, positive feedback is generated such that an increase in the forward current $I_F$ results in self-heat-generation causing an increase in the forward current $I_F$, leading to destruction. The characteristic in this case is represented by a course of 0→Q→R→A in FIG. 2.

2. When the p⁺ Type Region 5 Having Sufficiently High Acceptor Concentration is Disposed in a Portion of the Anode Electrode (Schottky Electrode) 7 (Embodiment)

Holes flow into the p⁺ type region 5 at a certain reverse bias voltage $V_K$ due to avalanche breakdown in the Schottky interface to which reverse bias is applied between the Schottky electrode 7 and the p⁺ type region 5. The holes are injected from the p⁺ type region 5 into the n-type silicon carbide epitaxial layer 2, and the positive bias $V_F$ decreases due to conductivity modulation. As a result, the positive bias $V_F$ subsequently decreases from R to S in FIG. 2 due to an increase in the forward current $I_F$, resulting in a course of R-S-B. An amount of heat generation in this case is constant because of $P=V_1I_1=V_2I_2$. Since $I_2=(V_1/V_2)I_1>I_1$ is satisfied, the forward (surge) current $I_{F,SM}$ is improved.

3. Concerning Acceptor Concentration of the p⁺ Type Region 5

Figure 3:
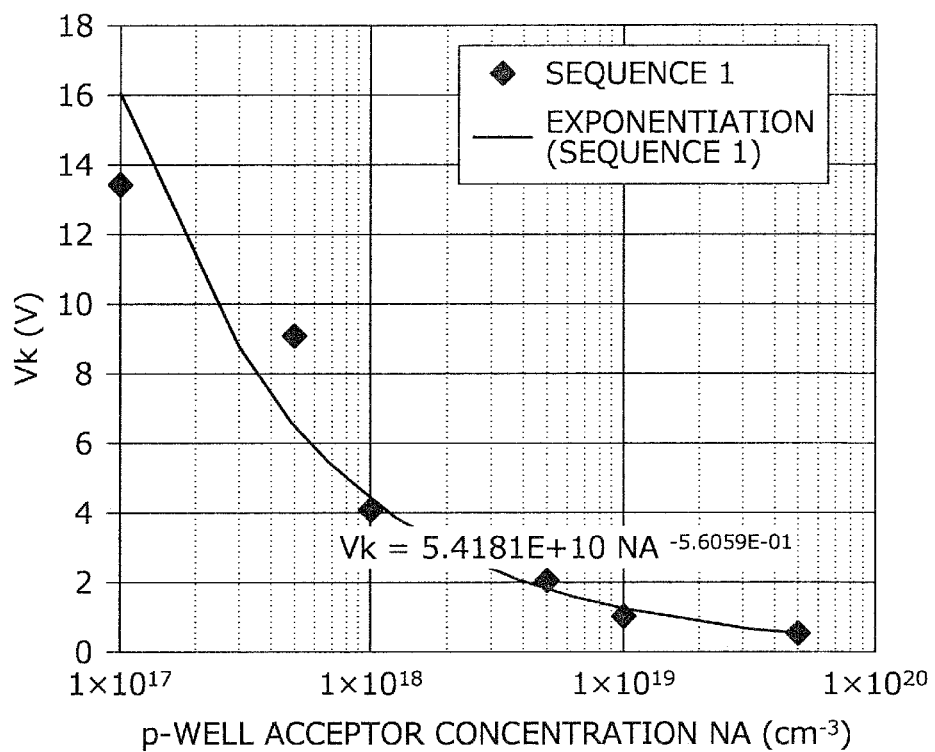
FIG. 3 is a chart of the relationship between the acceptor concentration of the p$^+$ type region and reverse bias voltage.

FIG. 3 is a chart of the relationship between the acceptor concentration of the p⁺ type region and reverse bias voltage. In 2. above, it is important to satisfy the reverse bias voltage $V_K<V_1$. This is dependent on an acceptor concentration ($N_A$) of the p⁺ type region 5. The greater $N_A$ is, the more the reverse bias voltage $V_K$ decreases. Assuming the reverse bias voltage $V_K=V_1=5$ V, the relationship between the reverse bias voltage $V_K$ and the acceptor concentration $N_A$ is derived based on FIG. 3. In FIG. 3, to make the reverse bias voltage $V_K$ equal to or less than 5 V, $N_A>8\times10^{17}$ (cm³) may be satisfied. The p-type region 3 at the edge may be a p⁻ type region.

4. The p-type Region 3 May be a p+ Type Region

Figure 4:
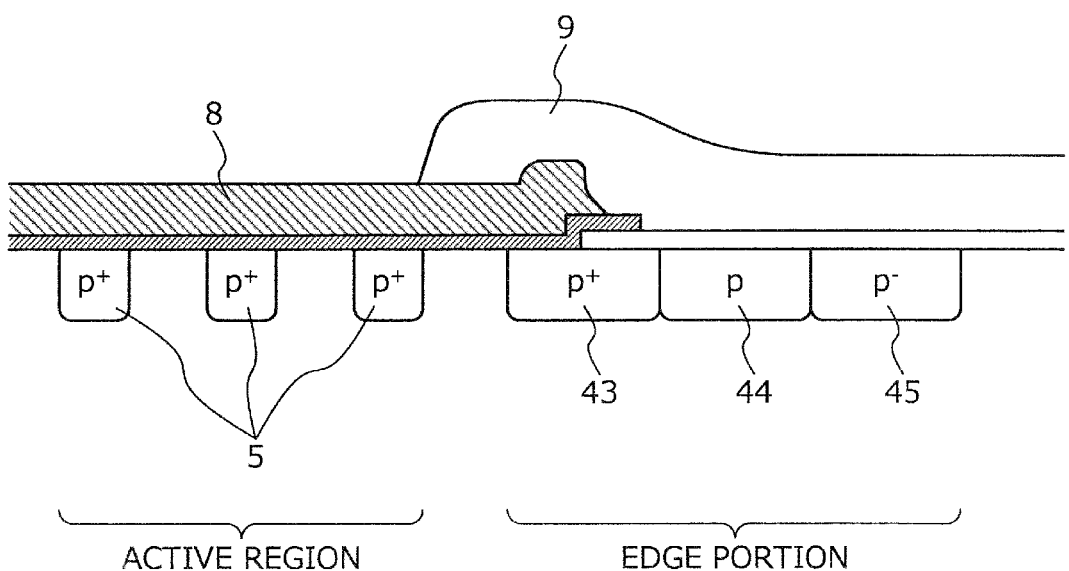
FIG. 4 is a cross-sectional view of a p$^+$ type region of a breakdown voltage structure portion disposed in an active region peripheral portion (edge portion) that surrounds the active region.

FIG. 4 is a cross-sectional view of a p+ type region 43 of a breakdown voltage structure portion disposed in an active region peripheral portion (edge portion) surrounding the active region. As depicted in FIG. 4, by disposing the p+ type region 43, a p-type region 44, and a p− type region 45 at the edge, the reverse bias voltage $V_K < V_1$ causes holes to flow into the p+ type region 43. If the p+ type region 43 is not disposed in the edge portion, the holes are injected into the active region; however, if the p+ type region 43 is disposed at the termination end of the Schottky electrode 7, the holes flow into the p-type region 44 and the p− type region 45 of the adjacent edge portion and a region of hole injection into the n-type silicon carbide epitaxial layer 2 includes both the active region and the edge portion. As a result, the conductivity modulation effect is produced in a larger area and lower resistance can be achieved. From this configuration, the characteristic of a course of 0→Q→R-S-C depicted in FIG. 2 is obtained. Since $I_3 = (V_2/V_3)I_2 > I_2$ is satisfied, the forward surge current $I_{F,SM}$ can further be increased.

As described above, according to the embodiment, by setting the concentration of the p-type region of the breakdown voltage structure portion disposed around the active region greater than or equal to a predetermined concentration, the forward surge current $I_{F,SM}$ in the Schottky structure can be increased and the breakdown voltage can be improved. Therefore, the reliability of the semiconductor device can be improved. The same effect can be achieved even from a MOSFET element structure instead of the diode element structure described in the embodiment.

INDUSTRIAL APPLICABILITY

As described above, the silicon carbide semiconductor device and the fabrication method of a silicon carbide semiconductor device according to the present invention are useful for a high-voltage semiconductor device used in power conversion equipment and power source devices of various industrial machines.

EXPLANATIONS OF LETTERS OR NUMERALS 1 n+ type silicon carbide substrate
2 n-type silicon carbide epitaxial layer
3 p-type region
4 p− type region
5 p+ type region
6 interlayer insulation film
7 Schottky electrode
8 electrode pad
9 protection film
10 back surface electrode

The invention claimed is:

1. A silicon carbide semiconductor device comprising:
a first-conductivity-type wide band gap semiconductor substrate;
a first-conductivity-type wide band gap semiconductor deposition layer deposited on a surface of the first-conductivity-type wide band gap semiconductor substrate and having an impurity concentration that is lower than that of the first-conductivity-type wide band gap semiconductor substrate;
a first second-conductivity-type semiconductor region selectively disposed in a surface layer of the first-conductivity-type wide band gap semiconductor deposition layer on a side opposite to the first-conductivity-type wide band gap semiconductor substrate;
an element structure made up of a metal film forming a Schottky junction with the first-conductivity-type wide band gap semiconductor deposition layer and the first second-conductivity-type semiconductor region;
an electrode pad being formed on the metal film and being thicker than the metal film;
a second second-conductivity-type semiconductor region selectively disposed in a surface layer of the first-conductivity-type wide band gap semiconductor deposition layer on the side opposite to the first-conductivity-type wide band gap semiconductor substrate, the second second-conductivity-type semiconductor region surrounding a peripheral portion of the element structure;
a third second-conductivity-type semiconductor region surrounding and being in contact with a peripheral portion of the second second-conductivity-type semiconductor region to make up a junction termination extension structure;
a protection film disposed on the junction terminal structure to cover end portions of the Schottky junction;
an interlayer insulation film covering a portion of the second second-conductivity-type semiconductor region closer to the third second-conductivity-type semiconductor region and the third second-conductivity-type semiconductor region, wherein
any one among the first and second second-conductivity-type semiconductor regions has an acceptor concentration that is greater than or equal to a predetermined concentration,
the acceptor concentrations of both of the first and second second-conductivity-type semiconductor regions are greater than $8 \times 10^{17}$ (cm$^{-3}$),
the first second-conductivity-type semiconductor region and the metal film are uniform, and
the metal film is in contact with a part of the second second-conductivity-type semiconductor region and overhangs the interlayer insulation film, an outer edge of the metal film and an outer edge of the electrode pad are positioned only over the second second-conductivity-type semiconductor region.

2. The silicon carbide semiconductor device according to claim 1, wherein
the first, second, and third second-conductivity-type semiconductor regions have an identical depth, and respective acceptor concentrations that are in descending order of the first, second, and third second-conductivity-type semiconductor regions.

3. The silicon carbide semiconductor device according to claim 1, wherein
the acceptor concentration is greater than $8 \times 10^{17}$ (cm$^{-3}$) when a reverse bias voltage is 5 (V).

* * * * *